United States Patent
Cheng et al.

(10) Patent No.: US 11,315,618 B2
(45) Date of Patent: Apr. 26, 2022

(54) MEMORY STORAGE DEVICE AND OPERATION METHOD THEREOF

(71) Applicant: Winbond Electronics Corp., Taichung (TW)

(72) Inventors: Wu-Chuan Cheng, Taichung (TW); Chien-Ti Hou, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/561,007

(22) Filed: Sep. 4, 2019

(65) Prior Publication Data
US 2021/0065764 A1    Mar. 4, 2021

(51) Int. Cl.
G06F 3/06 (2006.01)
G11C 11/406 (2006.01)
G11C 11/408 (2006.01)

(52) U.S. Cl.
CPC .......... *G11C 11/406* (2013.01); *G06F 3/0658* (2013.01); *G06F 3/0659* (2013.01); *G06F 3/0688* (2013.01); *G11C 11/4085* (2013.01)

(58) Field of Classification Search
None
See application file for complete search history.

(56) References Cited

U.S. PATENT DOCUMENTS

| | | | | |
|---|---|---|---|---|
| 7,624,310 B2 * | 11/2009 | Porterfield | .......... | G06F 13/4243 370/503 |
| 7,630,268 B2 * | 12/2009 | Eto | ....................... | G11C 11/406 365/222 |
| 8,077,537 B2 * | 12/2011 | Kawakubo | ............ | G11C 11/406 365/222 |
| 9,570,144 B2 | 2/2017 | Perego et al. | | |
| 2002/0051389 A1 | 5/2002 | Mizugaki et al. | | |
| 2005/0268022 A1 | 12/2005 | Pelley | | |
| 2016/0163377 A1 * | 6/2016 | Oh | ..................... | G11C 11/40618 365/222 |
| 2017/0213586 A1 * | 7/2017 | Kang | .................... | G06F 3/0659 |

FOREIGN PATENT DOCUMENTS

| | | |
|---|---|---|
| KR | 20070011618 | 1/2007 |
| KR | 20080088383 | 10/2008 |

OTHER PUBLICATIONS

"Office Action of Taiwan Counterpart Application," dated Dec. 3, 2019, p. 1-p. 9.
Office Action of Korea Counterpart Application, with English translation thereof, dated Aug. 31, 2020, pp. 1-7.

* cited by examiner

*Primary Examiner* — Brian R Peugh
(74) *Attorney, Agent, or Firm* — JCIPRNET

(57) ABSTRACT

A memory operation method applicable to a memory storage device is provided. The memory operation method including the following steps: receiving, from a memory controller, a first operation command for performing a first memory operation on a memory array of the memory storage device; and in response to the first operation command, transmitting first address information of the memory array corresponding to the first memory operation to the memory controller through a data interface of the memory storage device. In addition, a memory storage device using the memory operation method is also provided.

14 Claims, 5 Drawing Sheets

MEMORY STORAGE DEVICE AND OPERATION METHOD THEREOF

BACKGROUND OF THE INVENTION

1. Field of the Invention

The present invention relates to a storage technology, in particular, to a memory storage device and an operation method thereof.

2. Description of Related Art

With the evolution of the times, the clock frequencies of processors in electronic devices and the bandwidths of networks are increasingly advanced, so the use efficiency of memories plays an important role in the operation speed of the electronic devices. In some memory cells, due to the physical property that charges in a capacitor are lost over time, these memory cells are periodically refreshed to ensure the correctness of data therein. However, the refresh often reduces the use efficiency of a memory.

Referring to FIG. 1, after a refresh command is received from a controller at a first time point T1, a refresh counter calculates a word line, and the memory begins to refresh a memory cell on the word line. The controller doesn't learn the address calculated by the refresh counter, and the access to the memory cell during refresh results in an access error. So after issuing the refresh command to the memory at the first time point T1, the controller issues next command at a second time point T2 behind a specific time interval (e.g., row refresh cycle time tRFC), which results in a decrease in the use efficiency of the memory.

SUMMARY OF THE INVENTION

Embodiments of the present invention provide a memory storage device and an operation method thereof with high use efficiency and low cost.

The memory operation method according to an embodiment of the present invention is applicable to a memory storage device. The memory operation method includes the following steps: receiving, from a memory controller, a first operation command for performing a first memory operation on a memory array of the memory storage device; and in response to the first operation command, transmitting first address information of the memory array corresponding to the first memory operation to the memory controller through a data interface of the memory storage device.

The memory storage device according to an embodiment of the present invention includes a memory array, a command interface and a data interface. The command interface is coupled to the memory array and a memory controller for receiving, from the memory controller, a first operation command for performing a first memory operation on the memory array. The data interface is coupled to the command interface and the memory controller for transmitting, in response to the first operation command received by the command interface, first address information of the memory array corresponding to the first memory operation to the memory controller.

In order to make the aforementioned and other features and advantages of the present invention comprehensible, preferred embodiments accompanied with figures are described in detail below.

DESCRIPTION OF THE EMBODIMENTS

Figure 1:
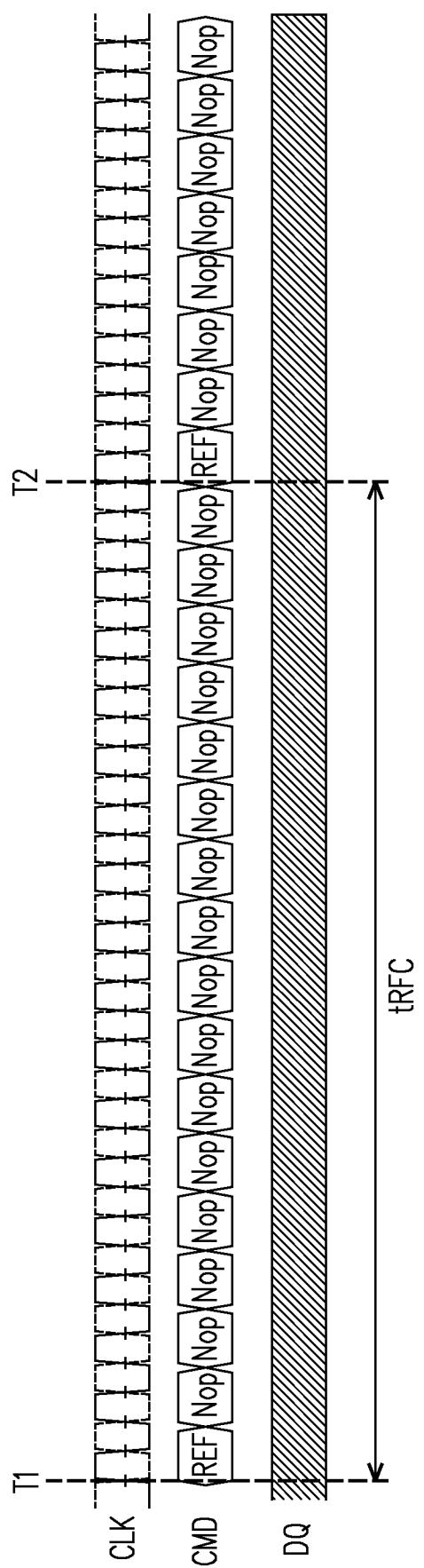
FIG. 1 is a timing diagram of a known refresh operation of a memory.
Figure 2:
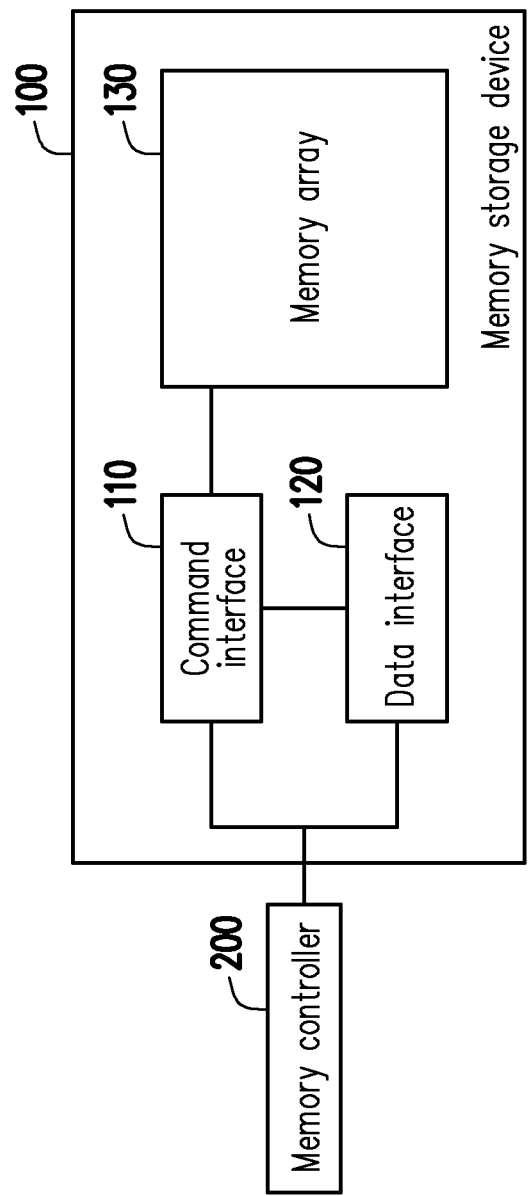
FIG. 2 is a schematic block diagram of a memory storage device according to an embodiment of the present invention.

FIG. 2 is a schematic block diagram of a memory storage device according to an embodiment of the present invention. Referring to FIG. 2, the memory storage device 100 includes at least a command interface 110, a data interface 120 and a memory array 130.

In the present embodiment, the memory storage device 100 is, for example, a volatile memory such as a dynamic random access memory. The command interface 110 and the data interface 120 are coupled to a memory controller 200 outside the memory storage device 100. The memory controller 200 issues commands to the memory storage device 100, such commands as activate, read, write, precharge and refresh, but the commands are not limited thereto.

In the present embodiment, the command interface 110 is coupled to the memory array 130 and the memory controller 200. The command interface 110 includes, for example, at least a command bus for receiving commands from the memory controller 200. In some embodiments, the command interface 110 further includes a circuit such as a command decoder, the implementation of the command interface 110 is comprehended by a person of ordinary skill in the art according to memory-related knowledge, and the descriptions thereof are omitted herein.

In the present embodiment, the data interface 120 is coupled to the command interface 110 and the memory controller 200. The data interface 120 includes, for example, a DQ bus or a DQ pin for receiving write data from the memory controller 200 or transmitting read data to the memory controller 200 when the memory controller 200 accesses data of the memory array 130. The implementation of the data interface 120 is comprehended by a person of ordinary skill in the art according to memory-related knowledge, and the descriptions thereof are omitted herein.

In the present embodiment, the memory storage device 100 uses, for example, a parallel bus architecture, so the memory storage device 100 further includes a clock bus, an address bus, a DQ strobe bus and the like not shown in FIG. 2, and the memory storage device 100 of the present invention is not limited thereto.

In the present embodiment, the memory array 130 includes a plurality of memory cells, and each of the memory cells is used to record data of one or more bits.

In the present embodiment, when the command interface 110 receives, from the memory controller 200, a first operation command for performing a first memory operation on the memory array 130, and the first memory operation does not need to be performed through the data interface 120, first address information of the memory array corresponding to the first memory operation is transmitted to the memory controller 200 through the data interface 120. In this way, when the memory controller 200 issues a second operation command for performing a second memory operation on the memory array 130 to the memory storage device 100 during the first memory operation, an address of the second memory operation is indicated according to the first address information of the first memory operation, thereby avoiding errors of the first memory operation and/or the second memory operation due to an address conflict between the two memory operations (e.g., the first memory operation and the second memory operation correspond to the same memory address).

For example, the memory storage device 100 receives, for example, from the command interface 110, a refresh command (first operation command) coming from the memory controller 200, calculates a word line address (first address information) in response to the refresh command, and refreshes the memory cell on the word line address in the memory array 130. In addition, after the word line address is calculated, the memory storage device 100 also notifies the memory controller 200 of the word line address of the memory cell being refreshed currently through the data interface 120 during the refresh. In this way, the memory controller 200 issues an access command to the memory storage device 100 during the refresh of the memory storage device 100 to avoid an address conflict, that is, the memory cell corresponding to the access command is different from the memory cell being refreshed. The address conflict is avoided by controlling a memory address corresponding to the access command according to the word line address, for example, the word line address corresponding to the access command is different from the memory address of the memory cell being refreshed, but the present invention is not limited thereto.

It should be noted that the present invention does not limit the first memory operation and the second memory operation here, and those skilled in the art replace different memory operations according to requirements based on the teaching of the present embodiment to achieve parallel operation of the memory storage device 100.

Figure 3:
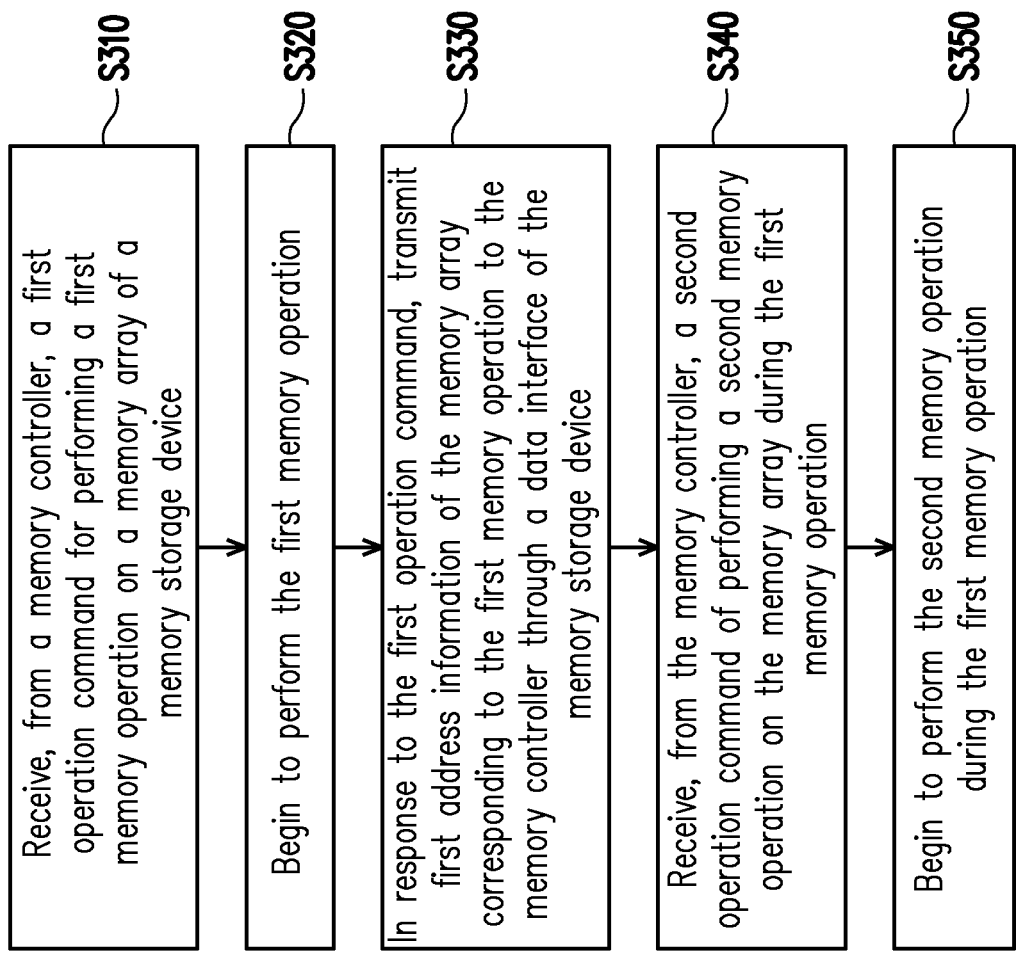
FIG. 3 is a process diagram of a memory operation method according to an embodiment of the present invention.
Figure 4:
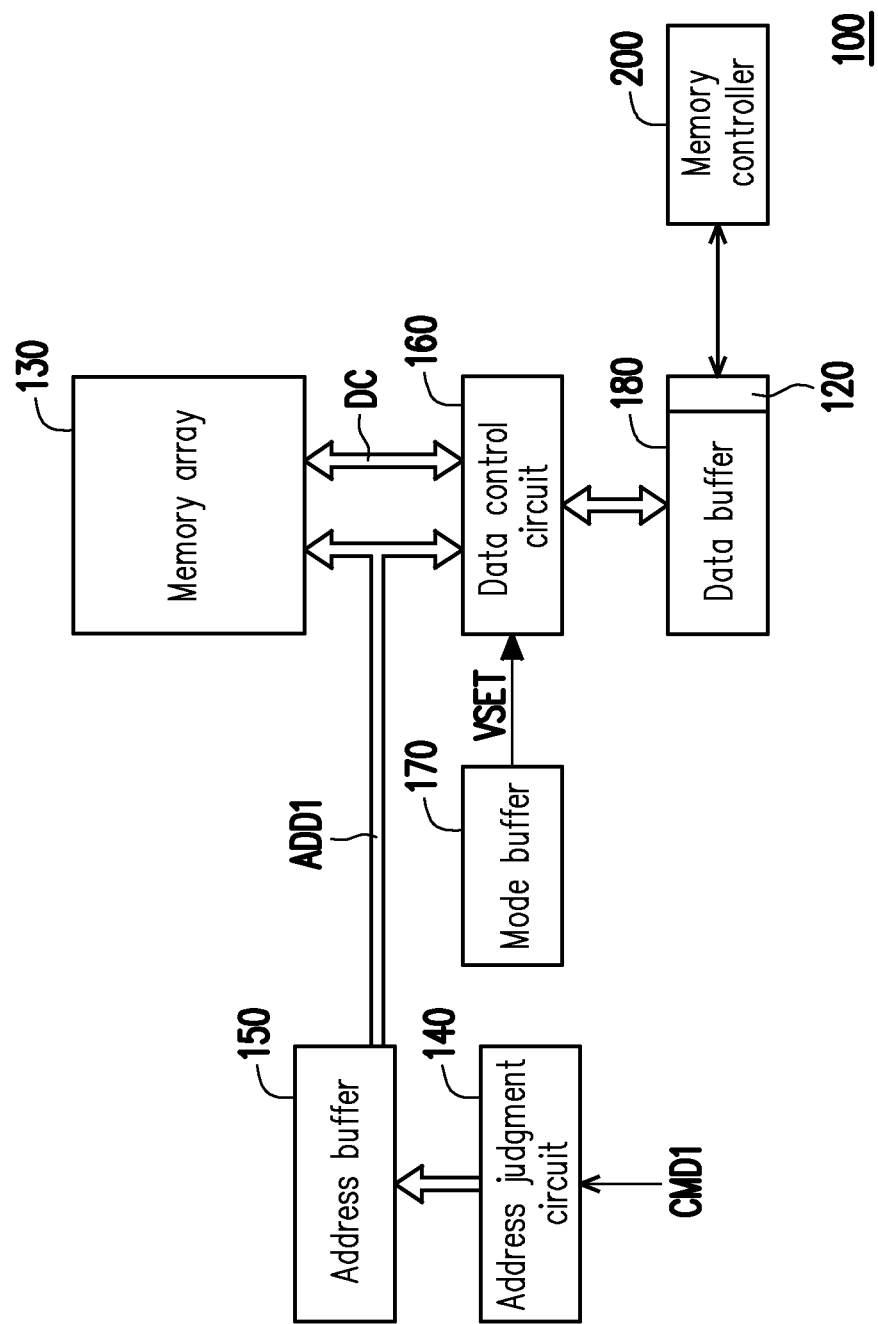
FIG. 4 is a block diagram of the memory operation method according to an embodiment of the present invention.
Figure 5:
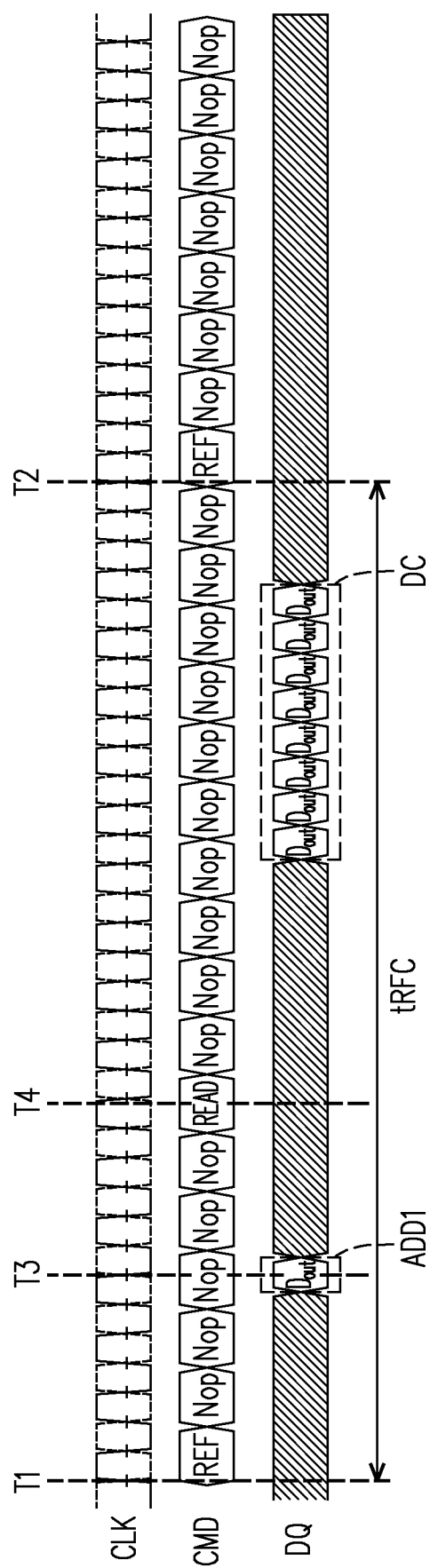
FIG. 5 is a timing diagram of the memory operation method according to an embodiment of the present invention.

FIG. 3 is a process diagram of a memory operation method according to an embodiment of the present invention. FIG. 4 is a schematic diagram of the memory operation method according to an embodiment of the present invention. FIG. 5 is a schematic diagram of the memory operation method according to an embodiment of the present invention. Please refer to FIG. 3 to FIG. 5 simultaneously. FIG. 3 to FIG. 5 are applicable to the memory storage device 100 in the embodiment of FIG. 2. The following gives detailed descriptions in combination with the components of the memory storage device 100.

Referring to FIG. 4, in addition to the command interface 110, the data interface 120 and the memory array 130 illustrated in FIG. 2, the memory storage device 100 further includes an address judgment circuit 140, an address buffer 150, a data control circuit 160, a mode buffer 170 and a data buffer 180.

Referring to FIG. 3, in step S310, the command interface 110 receives, from the memory controller 200, a first operation command CMD1 for performing a first memory operation on the memory array 130. Specifically, the memory controller 200, for example, issues the first operation command CMD1 to the memory storage device 100, and the memory storage device 100 receives the first operation command CMD1 through the command interface 110.

In the present embodiment, as shown in FIG. 4 and FIG. 5, the first operation command CMD1 is, for example, a refresh command REF for one block in the memory array 130, and the address judgment circuit 140 is, for example, a refresh counter, but the present invention is not limited thereto. In the present embodiment, the memory controller 200 issues a refresh command to the memory storage device 100 at a first time point T1, and the command interface 110 receives the refresh command at the first time point T1.

Referring to FIG. 3, in step S320, the memory storage device 100 begins to perform the first memory operation. Specifically, the memory storage device 100 performs the first memory operation on the memory array 130 according to the first operation command CMD1, including acquiring first address information ADD1 corresponding to the first memory operation.

In the present embodiment, as shown in FIG. 4 and FIG. 5, the refresh counter calculates, according to the refresh command REF, first address information ADD1, that is, a word line address in the block, and records the word line address in the address buffer 150. Then, the memory storage device 100 begins to perform a refresh operation on the memory cell at the word line address according to the address buffer 150 during a row refresh cycle time tRFC (i.e., between the first time point T1 and a second time point T2).

It is worth mentioning that the present invention limits neither the type of the first operation command herein, nor the type of the first address information herein. In other words, the first operation command includes any memory operation command that does not need to transmit data to the memory controller 200 through the data interface 120 in operation, and the first address information includes any address information related to at least one memory cell corresponding to the first memory operation, such as block information, bit line address information or row address information.

Referring to FIG. 3, in step S330, in response to the first operation command CMD1 received by the command interface 110, the data interface 120 transmits the first address information ADD1 of the memory array 130 corresponding to the first memory operation to the memory controller 200. Specifically, the memory storage device 100 transmits, after acquiring the first address information ADD1 corresponding to the first memory operation, the first address information ADD1 to the memory controller 200 through the data interface 120.

In the present embodiment, as shown in FIG. 4 and FIG. 5, the data interface 120 includes, for example, a data pin, and the data control circuit 160 is configured to access data from the memory array 130 and perform data communication with the data buffer 180. Within the row refresh cycle time tRFC, the memory storage device 100 not only performs the refresh operation on the memory cell on the word line address according to the address buffer 150, but also transmits the word line address in the address buffer 150 to the data buffer 180 through the data control circuit 160, and then transmits the word line address to the memory controller 200 through the data pin at a third time point T3.

In some embodiments, the mode buffer 170 coupled to the data control circuit 160 records a set value VSET, and the data control circuit 160 determines, according to the set value VSET in the mode buffer 170, whether to transmit the first address information ADD1 from the address buffer 150 to the data buffer 180. Accordingly, the function of "transmitting the first address information ADD1 to the memory controller 200 through the data interface 120" is enabled or disenabled by setting the set value VSET in the mode buffer 170.

Referring to FIG. 3, in step S340, the memory storage device 100 receives, from the memory controller 200, a second operation command of performing a second memory operation on the memory array 130 through the command interface 110 during the first memory operation. Specifically, after receiving the first address information ADD1, the memory controller 200 issues a second operation command to the memory storage device 100 according to the first address information ADD1 during the first memory operation, and the memory storage device 100 receives the second operation command from the memory controller 200 during the first memory operation through the command interface 110.

In the present embodiment, as shown in FIG. 4 and FIG. 5, the second operation command is, for example, a data access command READ for accessing data in one or more memory addresses of the memory array 130. When the memory controller 200 receives the word line address for performing refresh currently from the data pin at the third time point T3, the memory controller 200 issues, according to the word line address for performing refresh currently, a data read command READ (second operation command) to the memory storage device 100 at a fourth time point T4 within the row refresh cycle time tRFC, where the data read command READ is used to access data in at least one memory address not corresponding to the word line address for performing refresh currently in the memory array 130. It is worth mentioning that the above embodiment is merely exemplary, and the present invention does not limit the specific type of the second operation command herein. In some embodiments, the second operation command is also, for example, a data write command, a data update command, a data delete command, or other memory data access command.

Referring to FIG. 3, in step S350, the memory storage device 100 begins to perform the second memory operation during the first memory operation CMD1. Specifically, after the command interface 110 receives the second operation command during the first memory operation CMD1, the memory storage device 100 begins to perform the second memory operation corresponding to the second operation command. Therefore, the memory storage device 100 performs the first memory operation and the second memory operation in parallel.

In the present embodiment, as shown in FIG. 4 and FIG. 5, the memory controller 200 transmits the data read command READ to the memory storage device 100 at the fourth time point T4 within the row refresh cycle time tRFC. After the command interface 110 receives the data read command READ from the memory controller 200 at the fourth time point T4, read data DC corresponding to the data read command READ is read from the memory array 130 through the data control circuit 160 within the row refresh cycle time tRFC, and then the read data DC is transmitted to the memory controller 200 through the data buffer 180 and the data pin.

In this way, the memory storage device 100 also allows the memory controller 200 to access the data in the memory array 130 while refreshing the memory array 130.

Based on the above, the memory storage device and the operation method thereof according to the embodiments of the present invention notify the memory controller of the address information corresponding to the first memory operation through the data interface. The memory controller issues a second memory operation while the memory storage device performs the first memory operation, and avoids an address conflict between the first memory operation and the second memory operation, so that the first memory operation and the second memory operation are performed in parallel in the memory array, and the use efficiency of the memory is further greatly improved while the cost of circuit components and the like is maintained.

Although the present invention is disclosed in the above embodiments, the present invention is not limited thereto. Some alterations and modifications are made by those of ordinary skill in the art without departing from the spirit or scope of the present invention. Therefore, the protection scope of the present invention is set according to what is defined in the appended claims.

What is claimed is:

1. A memory operation method applicable to a memory storage device, the memory operation method comprising:
   receiving, from a memory controller, a first operation command for performing a first memory operation on a memory array of the memory storage device;
   in response to the first operation command, transmitting first address information of the memory array corresponding to the first memory operation to the memory controller through a data interface of the memory storage device,
   wherein before the step of transmitting the first address information of the memory array corresponding to the first memory operation to the memory controller through the data interface of the memory storage device, the memory operation method further comprising:
   calculating the first address information corresponding to the first memory operation;
   receiving the first address information, recording a set value and determining whether to transmit the first address information to the data interface according to the set value; and
   transmitting the first address information to the data interface according a determination result,
   wherein the first memory operation is an operation that is not performed through the data interface, and the first memory operation is a refresh operation.

2. The memory operation method according to claim 1, wherein the data interface is configured to transmit data to the memory controller or receive data from the memory controller when the memory controller accesses the data of the memory array.

3. The memory operation method according to claim 1, wherein after receiving, from the memory controller, the first operation command for performing the first memory operation on the memory array of the memory storage device, the method further comprises:
   in response to the first operation command, calculating the first address information corresponding to the first memory operation.

4. The memory operation method according to claim wherein the first address information comprises refresh word line information.

5. The memory operation method according to claim 1, further comprising:
   receiving, from the memory controller, a second operation command for performing a second memory operation on the memory array during the first memory operation.

6. The memory operation method according to claim 5, wherein at least one memory address corresponding to second address information corresponding to the second memory operation and at least one memory address corresponding to the first address information are not repeated.

7. The memory operation method according to claim 6, wherein the second memory operation is a data access operation.

8. The memory operation method according to claim 5, further comprising:
   performing the second memory operation during the first memory operation.

9. A memory storage device, comprising:
   a memory array;
   a command interface coupled to the memory array and a memory controller for receiving, from the memory controller, a first operation command for performing a first memory operation on the memory array;
   a data interface coupled to the command interface and the memory controller for transmitting, in response to the first operation command received by the command interface, first address information of the memory array corresponding to the first memory operation to the memory controller;
   an address judgment circuit coupled to the memory array and the data interface for calculating the first address information corresponding to the first memory operation, and transmitting the first address information to the data interface;
   a data control circuit coupled between the address judgment circuit and the data interface for receiving the first address information from the address judgment circuit, and determining whether to transmit the first address information to the data interface according to a set value; and
   a mode buffer coupled to the data control circuit for recording the set value,
   wherein the first memory operation is an operation that is not performed through the data interface, and the first memory operation is a refresh operation.

10. The memory storage device according to claim 9, wherein the data interface is at least one DQ pin.

11. The memory storage device according to claim 9, wherein the first address information comprises refresh word line information.

12. The memory storage device according to claim 9, wherein during the memory storage device performs the first memory operation, the command interface is further configured to receive, from the memory controller, a second operation command for performing a second memory operation on the memory array.

13. The memory storage device according to claim 12, wherein the second memory operation is a data access operation.

14. The memory storage device according to claim 12, wherein the memory storage device begins to perform the second memory operation during the first memory operation.

* * * * *